(12) United States Patent
Yun et al.

(10) Patent No.: US 8,867,282 B2
(45) Date of Patent: Oct. 21, 2014

(54) SEMICONDUCTOR APPARATUS WITH OPEN BIT LINE STRUCTURE

(75) Inventors: Tae Sik Yun, Icheon-si (KR); Kee Teok Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 364 days.

(21) Appl. No.: 13/339,183

(22) Filed: Dec. 28, 2011

(65) Prior Publication Data

US 2012/0218835 A1    Aug. 30, 2012

(30) Foreign Application Priority Data

Feb. 28, 2011    (KR) .................. 10-2011-0017688

(51) Int. Cl.
| | | |
|---|---|---|
| *G11C 7/00* | (2006.01) | |
| *G11C 29/00* | (2006.01) | |
| *G11C 29/24* | (2006.01) | |
| *G11C 11/4099* | (2006.01) | |
| *G11C 29/12* | (2006.01) | |
| *G11C 11/401* | (2006.01) | |

(52) U.S. Cl.
CPC ............ *G11C 11/4099* (2013.01); *G11C 29/24* (2013.01); *G11C 2029/1202* (2013.01); *G11C 11/401* (2013.01)
USPC ................... 365/189.11; 365/201; 365/210.1; 365/205; 365/206; 365/207

(58) Field of Classification Search
CPC .......... G11C 5/025; G11C 5/04; G11C 5/063; G11C 7/10; G11C 7/18; G11C 7/1042; G11C 7/1051; G11C 7/1006; G11C 8/04; G11C 8/12; G11C 8/14; G11C 8/18
USPC .............. 365/51, 63, 230.03, 230.04, 230.06, 365/189.12, 201, 210.1, 205, 206, 207
See application file for complete search history.

(56) References Cited

U.S. PATENT DOCUMENTS 5,532,963 A * 7/1996 Kushiyama et al. .......... 365/201
2010/0034004 A1 * 2/2010 Okahiro et al. ................ 365/51

FOREIGN PATENT DOCUMENTS

| KR | 1020060084104 A | 7/2006 |
|---|---|---|
| KR | 102007005347 A | 5/2007 |

* cited by examiner

*Primary Examiner* — Tha-O H Bui
(74) *Attorney, Agent, or Firm* — William Park & Associates Patent Ltd.

(57) ABSTRACT

A semiconductor apparatus with an open bit line structure includes a memory bank including a plurality of memory cell blocks and dummy mats, in which a plurality of bit lines are formed, a bit line sense amplifier configured to be arranged between the plurality of memory cell blocks and the dummy mats, compare a voltage difference between a bit line and a complementary bit line, and amplify the difference, and a dummy word line driving unit configured to selectively activate a dummy word line of the dummy mat in response to a test mode.

9 Claims, 4 Drawing Sheets

SEMICONDUCTOR APPARATUS WITH OPEN BIT LINE STRUCTURE

CROSS-REFERENCES TO RELATED APPLICATION

The present application claims priority under 35 U.S.C. §119(a) to Korean application number 10-2011-0017688, filed on Feb. 28, 2011, in the Korean Intellectual Property Office, which is incorporated herein by reference in its entirety.

BACKGROUND

1. Technical Field

The present invention relates generally to a semiconductor integrated circuit, and more particularly to a semiconductor apparatus with an open bit line structure.

2. Related Art

A bit line sense amplifier of a semiconductor memory apparatus such as a dynamic random access memory (DRAM) is an important circuit in the semiconductor memory apparatus because the bit line sense amplifier primarily amplifies a small signal difference occurring in a bit line due to charge sharing between a memory cell and the bit line after the memory cell is accessed.

In general, a bit line structure of a semiconductor memory apparatus may be classified into an open bit line structure and a folded bit line structure.

A semiconductor memory apparatus with the open bit line structure includes a bit line and a complementary bit line (or an inverted bit line) extending in an opposite direction from a bit line sense amplifier.

A semiconductor memory apparatus with the folded bit line structure includes a bit line and a complementary bit line extending in parallel with the bit line and each coupled to a bit line sense amplifier. The bit line and the complementary bit line form a bit line pair.

The semiconductor memory apparatus with the open bit line structure can include more memory cells than the semiconductor memory apparatus with the folded bit line structure. Thus, the semiconductor memory apparatus with the open bit line structure has been recently used.

SUMMARY

A semiconductor apparatus with an open bit line structure capable of reducing overstress is described herein.

BRIEF DESCRIPTION OF THE DRAWINGS

Features, aspects, and embodiments are described in conjunction with the attached drawings, in which.

DETAILED DESCRIPTION

Hereinafter, a semiconductor apparatus with an open bit line structure according to the present invention will be described in detail with reference to the accompanying drawings through an exemplary embodiment.

Figure 1:
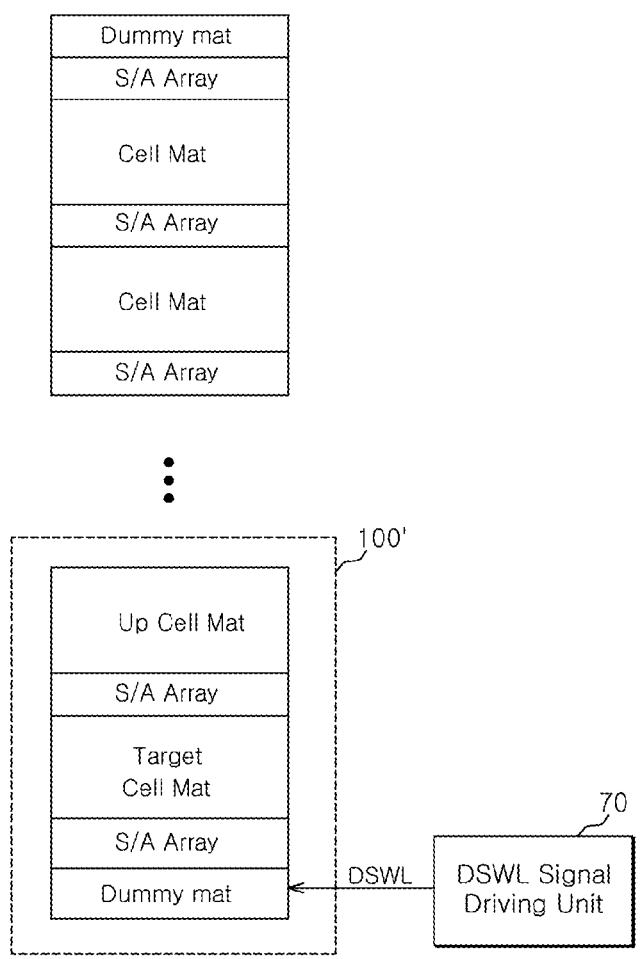
FIG. 1 is a configuration diagram illustrating a semiconductor apparatus with an open bit line structure according to an embodiment of the present invention.
Figure 2:
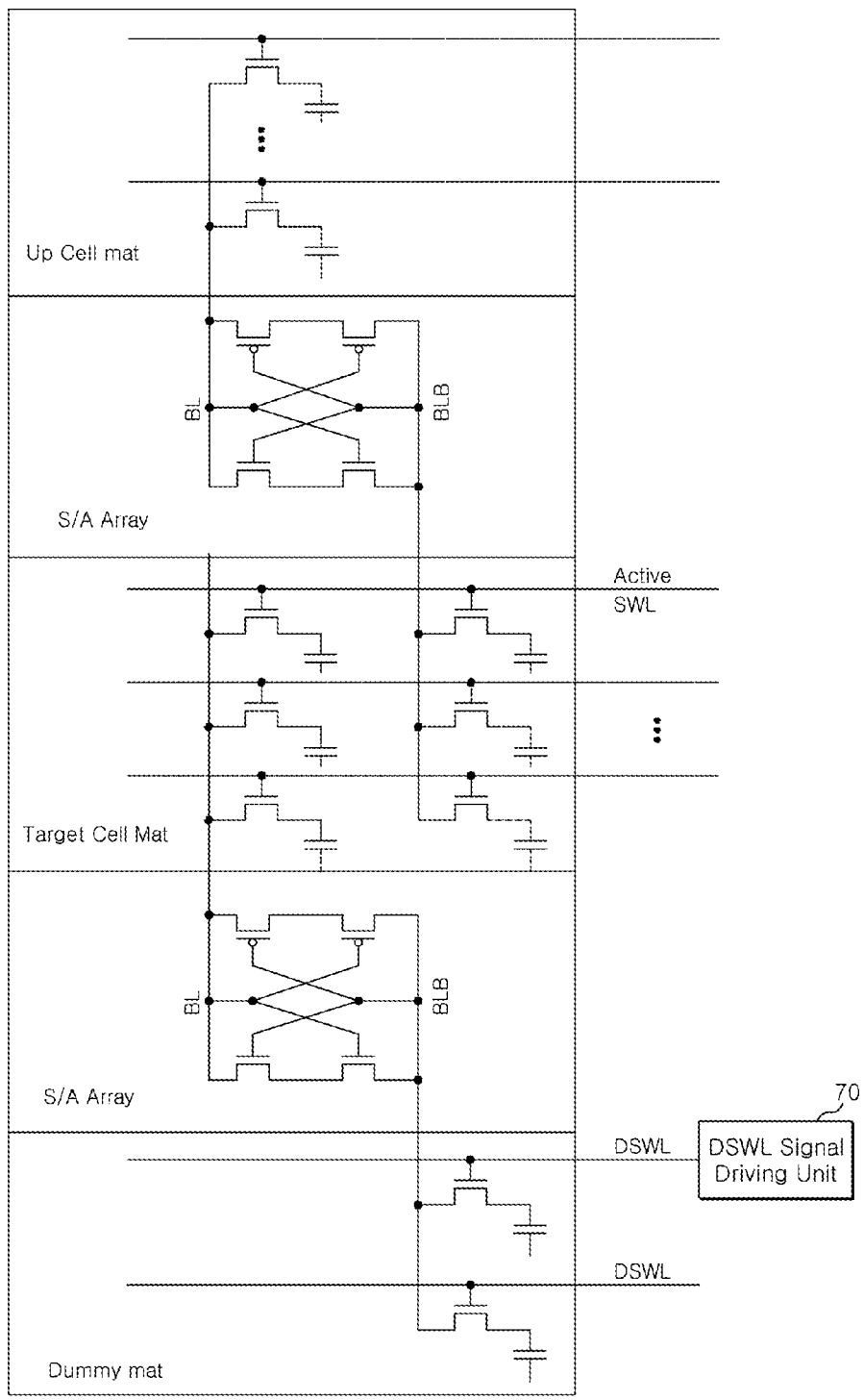
FIG. 2 is an detailed circuit diagram illustrating a part of a semiconductor apparatus with an open bit line structure according to an embodiment of the present invention.

FIG. 1 is a configuration diagram illustrating a semiconductor apparatus with an open bit line structure according to an embodiment of the present invention, and FIG. 2 is an detailed circuit diagram illustrating a part of the semiconductor apparatus with the open bit line structure according to the embodiment of the present invention.

As illustrated in FIG. 1 and FIG. 2, a semiconductor apparatus 100 according to an embodiment of the present invention includes a plurality of memory cell blocks (hereinafter, referred to as Cell Mats), a plurality of sense amplifier arrays (S/A Arrays), and a dummy mat Dummy Mat.

Each memory cell block Cell Mat may include memory cells (not illustrated) for storing data. The memory cells are arranged in areas defined by bit lines (not illustrated) and word lines (not illustrated), which cross each other, and areas defined by complementary bit lines (BLBs) and sub-word lines (SWLs) which cross each other. The memory cell includes a NMOS transistor (a cell transistor) and a cell capacitor.

The plurality of sense amplifier arrays (S/A Arrays) may be arranged between two adjacent memory cell blocks (Cell Mats). Each sense amplifier array (S/A Array), for example, may include open bit line sense amplifiers.

When one of the plurality of sense amplifier arrays (S/A Arrays) is arranged between an up cell mat and a target cell mat as illustrated in FIG. 2, it is possible to compare a voltage of a bit line of the up cell mat with a voltage of a complementary bit line of the target cell mat, and amplify the voltage difference.

When another sense amplifier of the plurality of sense amplifier arrays (S/A Arrays) is arranged between the target cell mat and a dummy mat cell as illustrated in FIG. 2, it is possible to compare a voltage of a bit line of the target cell mat with a voltage of a complementary bit line of the dummy mat cell, and amplify the voltage difference.

The dummy mat Dummy mat may be arranged at one or more of the uppermost end and the lowermost end of the memory cell block Cell Mat, that is, at the peripheral regions of the memory cell block, and is arranged below the target cell mat Target Cell Mat of FIG. 2 to provide a level of a complementary bit line to be compared to the target cell mat Target Cell Mat, resulting in the improvement of a net die Net Die.

In the dummy mat Dummy mat, a plurality of bit lines and a plurality of dummy word lines, which are arranged while crossing each other, may be formed, in the same manner as the respective is memory cell array blocks.

In the case in which a test operation is performed on a semiconductor apparatus, when a high level voltage is applied to the semiconductor apparatus and also a high temperature test operation is performed to shift an activated word line, since a dummy mat is always tested in an enable state, the dummy mat may be damaged by overstress.

Consequently, the semiconductor apparatus 100 according to the embodiment is provided with a DSWL signal driving unit (70 of FIG. 3) or a DSWLB signal driving unit (70 of FIG. 6), which controls a dummy word line of the dummy mat Dummy mat, thereby selectively deactivating the dummy mat according to a test mode, resulting in the reduction in overstress.

Figure 3:
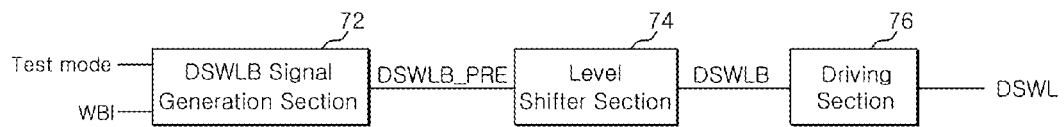
FIG. 3 is a detailed circuit diagram illustrating a DSWL signal driving unit of a semiconductor apparatus with an open bit line structure according to an embodiment of the present invention.

FIG. 3 is a detailed circuit diagram illustrating the DSWL signal driving unit of the semiconductor apparatus with the open bit line structure according to an embodiment of the present invention.

As illustrated in FIG. 3, the DSWL signal driving unit 70 according to an embodiment of the present invention includes a DSWLB signal generation section 72, a level shifter section 74, and a driving section 76.

The DSWLB signal generation section 72 may generate a preliminary DSWLB signal DSWLB_PRE in response to first and second test modes (Test Mode and WBI). According to the embodiment, the first test mode Test Mode, for example, may be a DSWL off signal, and the second test mode WBI, for example, may be is a wafer burn-in test activation signal.

Figure 4:
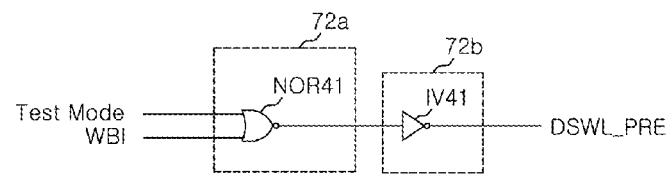
FIG. 4 is a detailed circuit diagram illustrating a DSWLB signal generation section of a DSWL signal driving unit of FIG. 3.

According to the embodiment, the DSWLB signal generation section 72 may include a NOR gate 72a and an inverter 72b as illustrated in FIG. 4.

In further detail, if one or more high-level signals of the first and second test modes (Test Mode and WBI) are input, the DSWLB signal generation section 72 may generate a low-level preliminary DSWLB signal DSWLB_PRE. The low-level preliminary DSWLB signal DSWLB_PRE may be inverted to a high-level preliminary DSWLB signal DSWLB_ PRE by the inverter 72b, and may be input to the level shifter section 74.

In addition, if each of the first and second test modes (Test Mode and WBI) is input at a low level, the DSWLB signal generation section 72 may generate a high-level preliminary DSWLB signal DSWLB_PRE. The high-level preliminary DSWLB signal DSWLB_PRE may be inverted to a low-level preliminary DSWLB signal DSWLB_PRE by the inverter 72b, and may be input to the level shifter section 74.

The level shifter section 74 may shift the level of the preliminary DSWLB signal DSWLB_PRE which is output from the DSWLB signal generation section 72, thereby generating and outputting a DSWLB signal DSWLB. Since the level shifter section 74 is generally used in the semiconductor apparatus 100, detailed description thereof will be omitted.

The driving section 76 is configured to reduce the loading for driving a DSWL signal DSWL, and may invert the DSWLB signal DSWLB which is input from the level shifter section 74, and generate and output the DSWL signal DSWL.

Figure 5:
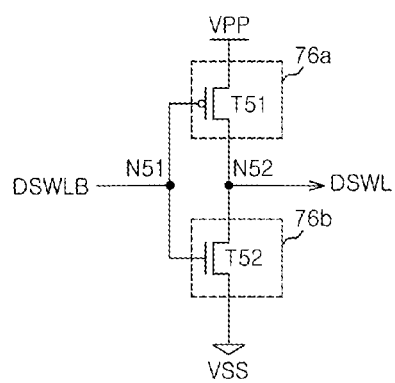
FIG. 5 is a detailed circuit diagram illustrating a driving section of a DSWL signal driving unit of FIG. 3.

As illustrated in FIG. 5, in the driving section 76, first and second transistors T51 and T52 are coupled in series to each other to receive the DSWLB signal DSWLB as a gate signal, and the DSWL signal DSWL may be generated through a $52^{th}$ node N52 formed between the first and second transistors T51 and T52.

In detail, a drain of the first transistor T51 may be coupled to an internal voltage terminal VPP, and a source of the first transistor T51 may be electrically connected to a drain of the second transistor T52. A source of the second transistor T52 may be electrically connected to a ground voltage terminal VSS.

Hereinafter, the operation of the DSWL signal driving unit 70 will be described. If one or more high-level signals of the first and second test modes (Test Mode and WBI) are input, the DSWLB signal generation section 72 may generate a low-level preliminary DSWLB signal DSWLB_PRE. The low-level preliminary DSWLB signal DSWLB_PRE may be inverted to a high-level preliminary DSWLB signal DSWLB_ PRE by the inverter 72b, and may be input to the level shifter section 74.

The level shifter section 74 may shift the level of the high-level preliminary DSWLB signal DSWLB_PRE, thereby generating a high-level DSWLB signal DSWLB.

The driving section 76 inverts the high-level DSWLB signal DSWLB to output a low-level DSWL signal DSWL, thereby is deactivating a dummy word line of a dummy cell.

In addition, if each of the first and second test modes (Test Mode and WBI) is input at a low level, the DSWLB signal generation section 72 may generate a high-level preliminary DSWLB signal DSWLB_PRE. The high-level preliminary DSWLB signal DSWLB_PRE may be inverted to a low-level preliminary DSWLB signal DSWLB_PRE by the inverter 72b, and may be input to the level shifter section 74.

The level shifter section 74 may shift the level of the low-level preliminary DSWLB signal DSWLB_PRE, thereby generating a low-level DSWLB signal DSWLB.

The driving section 76 inverts the low-level DSWLB signal DSWLB to output a high-level DSWL signal DSWL, thereby activating the dummy word line of the dummy cell.

As described above, when the test operation is performed with respect to the semiconductor apparatus, the DSWL signal driving unit 70 according to an embodiment of the present invention deactivates the DSWL signal, thereby reducing overstress of the dummy mat in the test operation.

Figure 6:
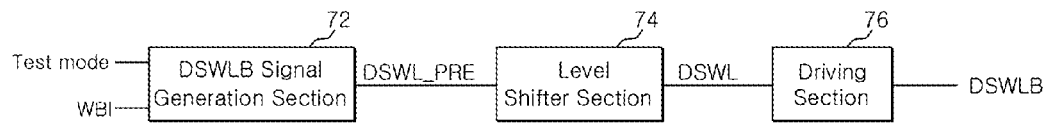
FIG. 6 is a detailed circuit diagram illustrating a DSWLB signal driving unit of a semiconductor apparatus with an open bit line structure according to an embodiment of the present invention.

FIG. 6 is a detailed circuit diagram illustrating a DSWLB signal driving unit of a semiconductor apparatus with an open bit line structure according to an embodiment of the present invention.

As illustrated in FIG. 6, a DSWLB signal driving unit 70 according to an embodiment of the present invention includes a DSWL signal generation section 72, a level shifter section 74, and a driving section 76.

The DSWL signal generation section 72 may generate a preliminary DSWL signal DSWL_PRE in response to signals indicating first and second test modes (Test Mode and WBI). According to an embodiment of the present invention, the first test mode Test Mode, for example, may be a DSWL off signal, and the second test mode WBI, for example, may be a wafer burn-in test activation signal.

Figure 7:
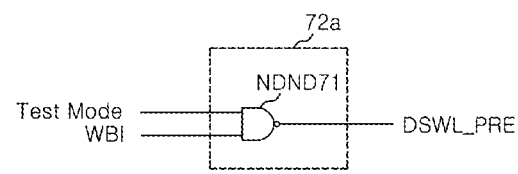
FIG. 7 is a detailed circuit diagram illustrating a DSWL signal generation section of a DSWLB signal driving unit of FIG. 6.

According to an embodiment of the present invention, the DSWL signal generation section 72 may include a NAND gate 72a as illustrated in FIG. 7.

In further detail, if one or more low-level signals of the first and second test modes (Test Mode and WBI) are input, the DSWL signal generation section 72 may generate a high-level preliminary DSWL signal DSWL_PRE.

In addition, if each of the first and second test modes (Test Mode and WBI) is input at a high level, the DSWL signal generation section 72 may generate a low-level preliminary DSWL signal DSWL_PRE.

The level shifter section 74 may shift the level of the preliminary DSWL signal DSWL_PRE which is output from the DSWL signal generation section 72, thereby generating and outputting a DSWL signal DSWL. The level shifter section 74 is generally used in the semiconductor apparatus 100, detailed description thereof will be omitted.

The driving section 76 is for reducing the loading for driving a DSWLB signal DSWLB, and may invert the DSWL signal DSWL which is input from the level shifter section 74, and generate and output the DSWLB signal DSWLB.

Figure 8:
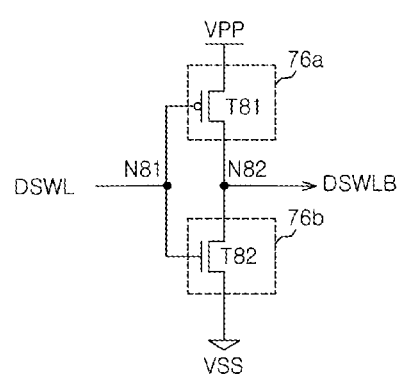
FIG. 8 is a detailed circuit diagram illustrating a driving section of a DSWLB signal driving unit of FIG. 6.

As illustrated in FIG. 8, in the driving section 76, first and second transistors T81 and T82 are coupled in series to each other to receive the DSWL signal DSWL as a gate signal, and the level of the DSWLB signal DSWLB may be determined through a $82^{th}$ node N82 formed between the first and second transistors T81 and T82.

The first transistor T81, for example, may include a PMOS transistor, and the second transistor T82, for example, may include a NMOS transistor.

In detail, a drain of the first transistor T81 may be coupled to an internal voltage terminal VPP, and a source of the first transistor T81 may be electrically connected to a drain of the second transistor T82. A source of the second transistor T82 may be electrically connected to a ground voltage terminal VSS.

Hereinafter, the operation of the DSWLB signal driving unit 70 will be described. If one or more signals of the first and second test modes (Test Mode and WBI) are input at a low level, the DSWL signal generation section 72 may generate a high-level preliminary DSWL signal DSWL_PRE.

The level shifter section 74 may shift the level of the high-level preliminary DSWL signal DSWL_PRE, thereby generating a high-level DSWL signal DSWL.

The driving section 76 inverts the high-level DSWL signal DSWL to output a low-level DSWLB signal DSWLB, thereby is deactivating a dummy word line of a dummy cell.

In addition, if each of the first and second test modes (Test Mode and WBI) is input at a high level, the DSWL signal generation section 72 may generate a low-level preliminary DSWL signal DSWL_PRE.

The level shifter section 74 may shift the level of the low-level preliminary DSWL signal DSWL_PRE, thereby generating a low-level DSWL signal DSWL.

The driving section 76 inverts the low-level DSWL signal DSWL to output a high-level DSWLB signal DSWLB, thereby activating the dummy word line of the dummy cell.

As described above, when the test operation is performed with respect to the semiconductor apparatus, the DSWLB signal driving unit 70 according to an embodiment of the present invention activates the DSWLB signal DSWLB, thereby reducing overstress from being applied to the dummy mat in the test operation.

While certain embodiments have been described above, it will be understood to those skilled in the art that the embodiments described are by way of example only. Accordingly, the semiconductor apparatus with an open bit line structure described herein should not be limited based on the described embodiments. Rather, the semiconductor apparatus with an open bit line structure described herein should only be limited in light of the claims that follow when taken in conjunction with the above description and accompanying drawings.

What is claimed is:

1. A semiconductor apparatus with an open bit line structure, comprising:
    a memory bank including a plurality of memory cell blocks and dummy mats, wherein a plurality of bit lines are formed in the plurality of memory cell blocks and dummy mats;
    a bit line sense amplifier configured to be arranged between the plurality of memory cell blocks and the dummy mats, compare a voltage difference between a bit line and a complementary bit line, and amplify the difference; and
    a dummy word line driving unit configured to selectively activate a dummy word line of the dummy mat in response to a test mode,
    wherein, when a test operation is performed with respect to the semiconductor apparatus, the dummy word line driving unit deactivates a dummy word line signal and applies a deactivated dummy word line signal to the dummy mat,
    wherein the dummy word line driving unit comprises:
    a complementary dummy word line signal generation section configured to generate a preliminary complementary dummy word line signal in response to a plurality of test mode signals;
    a level shifter section configured to shift a level of the preliminary complementary dummy word line signal, which is output from the complementary dummy word line signal generation section, and generate a complementary dummy word line signal; and
    a driving section configured to invert a level of the complementary dummy word line signal, which is output from the level shifter section, and generate a dummy word line signal.

2. The semiconductor apparatus with an open bit line structure according to claim 1, wherein the complementary dummy word line signal generation section comprises:
    a NOR gate configured to generate a low-level complementary dummy word line signal when one or more signals of the test mode signals are input at a high level; and
    an inverter configured to invert and output the level of the complementary dummy word line signal which is output from the NOR gate part.

3. The semiconductor apparatus with an open bit line structure according to claim 1, wherein the test mode signals include a dummy word line off signal and a wafer burn-in test activation signal.

4. A semiconductor apparatus with an open bit line structure, comprising:
    a memory bank including a plurality of memory cell blocks and dummy mats, wherein a plurality of bit lines are formed in the plurality of memory cell blocks and dummy mats;
    a bit line sense amplifier configured to be arranged between the plurality of memory cell blocks and the dummy mats, compare a voltage difference between a bit line and a complementary bit line, and amplify the difference; and
    a dummy word line driving unit configured to deactivate a dummy word line signal when a test operation is performed with respect to a semiconductor apparatus,
    wherein the dummy word line driving unit comprises:
    a complementary dummy word line signal generation section configured to generate a preliminary complementary dummy word line signal in response to a plurality of test mode signals;
    a level shifter section configured to shift a level of the preliminary complementary dummy word line signal, which is output from the complementary dummy word line signal generation section, and generate a complementary dummy word line signal; and
    a driving section configured to invert a level of the complementary dummy word line signal, which is output from the level shifter section, and generate the dummy word line signal.

5. The semiconductor apparatus with an open bit line structure according to claim 4, wherein the complementary dummy word line signal generation section comprises:

a NOR gate configured to generate a low-level preliminary complementary dummy word line signal when one or more signals of the test mode signals are input at a high level; and an inverter configured to invert and output the level of the preliminary complementary dummy word line signal which is output from the NOR gate part.

6. The semiconductor apparatus with an open bit line structure according to claim 4, wherein the test mode signals include a dummy word line off signal and a wafer burn-in test activation signal.

7. A semiconductor apparatus with an open bit line structure, comprising:

a memory bank including a plurality of memory cell blocks and dummy mats, wherein a plurality of bit lines are formed in the plurality of memory cell blocks and dummy mats;

a bit line sense amplifier configured to be arranged between the plurality of memory cell blocks and the dummy mats, compare a voltage difference between a bit line and a complementary bit line, and amplify the difference; and a complementary dummy word line driving unit configured to activate a complementary dummy word line signal when a test operation is performed with respect to a semiconductor apparatus, wherein the complementary dummy word line driving unit comprises:

a dummy word line signal generation section configured to generate a preliminary dummy word line signal in response to a plurality of test mode signals;

a level shifter section configured to shift a level of the preliminary dummy word line signal, which is output from the dummy word line signal generation section, and generate a dummy word line signal; and a driving section configured to invert a level of the dummy word line signal, which is output from the level shifter section, and generate the complementary dummy word line signal.

8. The semiconductor apparatus with an open bit line structure according to claim 7, wherein the dummy word line signal generation section comprises:

a NAND gate configured to generate a high-level preliminary dummy word line signal when one or more signals of the test mode signals are input at a low level.

9. The semiconductor apparatus with an open bit line structure according to claim 7, wherein the test mode signals include a dummy word line off signal and a wafer burn-in test activation signal.

* * * * *